(12) United States Patent
Graßl et al.

(10) Patent No.: US 10,879,654 B2
(45) Date of Patent: Dec. 29, 2020

(54) RF PCB CONNECTOR WITH A SURFACE-MOUNT INTERFACE

(71) Applicant: SPINNER GmbH, Munich (DE)

(72) Inventors: Martin Graßl, Erding (DE); Wolfgang Zißler, Feldkirchen Westerham (DE)

(73) Assignee: SPINNER GMBH

( * ) Notice: Subject to any disclaimer, the term of this patent is extended or adjusted under 35 U.S.C. 154(b) by 0 days.

(21) Appl. No.: 16/712,426

(22) Filed: Dec. 12, 2019

(65) Prior Publication Data
US 2020/0119502 A1    Apr. 16, 2020

Related U.S. Application Data

(63) Continuation of application No. PCT/EP2018/068205, filed on Jul. 5, 2018.

(30) Foreign Application Priority Data

Jul. 20, 2017   (EP) .................................... 17182262

(51) Int. Cl.
*H01R 12/00* (2006.01)
*H01R 24/50* (2011.01)
(Continued)

(52) U.S. Cl.
CPC ............ *H01R 24/50* (2013.01); *H01R 24/44* (2013.01); *H05K 1/0243* (2013.01); *H01R 2103/00* (2013.01)

(58) Field of Classification Search
CPC .... H01R 2103/00; H01R 13/113; H01R 13/11
(Continued)

(56) References Cited

U.S. PATENT DOCUMENTS

| 4,669,805 A | 6/1987 | Kosugi et al. |
| 5,334,050 A | 8/1994 | Andrews |

(Continued)

FOREIGN PATENT DOCUMENTS

| CN | 103579871 A | 2/2014 |
| JP | 2014107733 A | 6/2014 |

(Continued)

OTHER PUBLICATIONS

National Intellectual Property Administration, PRC. First Office Action for application 201880044648.5, dated Sep. 3, 2020. With translation.

(Continued)

*Primary Examiner* — Thanh Tam T Le
(74) *Attorney, Agent, or Firm* — Yakov S. Sidorin; Quarles & Brady LLP

(57) ABSTRACT

An RF-connector system includes an RF-connector with PCB interface, which contains a housing, a coaxial RF-connector interface, and a PCB contact section together with the PCB. A mechanical connection is made by two wing-shaped surface mount sections of the housing having a plurality of surface mount studs adapted to match with pads on the PCB. The electrical connection to the PCB is made by an inner conductor and at least one matching block electrically connected to the housing and providing a matched impedance at the PCB, which has a strip line with a ground plane.

14 Claims, 5 Drawing Sheets

(51) Int. Cl.
 *H01R 24/44* (2011.01)
 *H05K 1/02* (2006.01)
 *H01R 103/00* (2006.01)

(58) Field of Classification Search
 USPC .................. 439/63, 578, 581, 582, 854, 855
 See application file for complete search history.

(56) References Cited

U.S. PATENT DOCUMENTS

| | | | | |
|---|---|---|---|---|
| 5,478,258 | A * | 12/1995 | Wang | H01R 24/50 |
| | | | | 439/581 |
| 5,897,384 | A * | 4/1999 | Hosler, Sr. | H01R 24/50 |
| | | | | 439/581 |
| 6,053,744 | A | 4/2000 | Gray | |
| 6,607,400 | B1 | 8/2003 | Ko | |
| 6,790,047 | B2 * | 9/2004 | Togashi | H01R 24/50 |
| | | | | 439/188 |
| 7,049,903 | B2 * | 5/2006 | Herstein | H01P 5/085 |
| | | | | 333/260 |
| 7,500,855 | B2 * | 3/2009 | Kari | H01R 24/50 |
| | | | | 439/63 |
| 7,665,998 | B2 * | 2/2010 | Kressner | H01R 12/57 |
| | | | | 439/63 |
| 7,785,142 | B2 * | 8/2010 | Hardy | H01R 13/6272 |
| | | | | 439/578 |
| 7,946,854 | B2 * | 5/2011 | Weidner | H01R 24/50 |
| | | | | 439/63 |
| 8,152,534 | B1 | 4/2012 | Li | |
| 8,506,306 | B2 * | 8/2013 | Liu | H01R 24/50 |
| | | | | 439/63 |
| 9,039,424 | B2 * | 5/2015 | Camelio | H01R 24/50 |
| | | | | 439/581 |
| 2009/0269984 | A1 | 10/2009 | Pesant | |
| 2011/0217853 | A1 | 9/2011 | Cornic | |
| 2013/0115787 | A1 | 5/2013 | Kanda | |
| 2014/0342581 | A1 | 11/2014 | Clyatt | |

FOREIGN PATENT DOCUMENTS

| | | |
|---|---|---|
| WO | 1998024147 A1 | 6/1998 |
| WO | 2005109577 A2 | 11/2005 |

OTHER PUBLICATIONS

National Intellectual Property Administration, PRC. Search Report for application 201880044648.5, dated Aug. 21, 2020. With translation.

* cited by examiner

RF PCB CONNECTOR WITH A SURFACE-MOUNT INTERFACE

CROSS-REFERENCE TO RELATED APPLICATIONS

This application is a continuation of the pending International Application No. PCT/EP2018/068205 filed on 5 Jul. 2018, which designates the United States and claims priority from European Application No. 17182262.0 filed on 20 Jul. 2017. The disclosure of each of the above-mentioned applications is incorporated by reference herein.

BACKGROUND

1. Field of the Invention

The invention relates to an RF-PCB connector assembly which may be used for milli-meter waves and which has a surface-mount interface for a printed circuit board (PCB).

2. Description of Relevant Art

An RF connector assembly is disclosed in U.S. Pat. No. 6,607,400 B1. A connector is mounted into a cutout of a printed circuit board. The electrical contact is established by soldering pads to a ground plane and to a signal line. Due to its design, as a skilled artisan will readily appreciate, such connector is only suitable for operation at frequencies up to order of magnitude of 1 GHz. The connector is a miniature pushbutton connector. A larger connector with a higher weight cannot be mounted by the disclosed PCB interface.

A millimeter-wave connector for interconnecting a microstrip circuit and an external circuit is disclosed in U.S. Pat. No. 4,669,805. The connector is held in a housing, which also contains a microstrip substrate to be connected to the connector. During assembly, the flexible center conductor of the connector has to be bent to adapt to the microstrip circuit. Bending of the center conductor may cause asymmetries, which degrade the electrical characteristics of the connector.

SUMMARY OF THE INVENTION

The embodiments are providing a millimeter-wave connector, which is configured for and can be mounted to a printed circuit board (PCB) or any other microstrip substrate without requiring complex and expensive mounting tools. The connector should be designed such, that it can be mounted by automated tools.

In an embodiment, a millimeter wave or RF connector for printed circuit boards includes housing, an RF connector interface, and a printed circuit board interface. The RF-PCB connector defines a mounting plane. The mounting plane is a common plane of all surface mount components of the connector. It is also a plane of a PCB to which the connector may be mounted.

The RF connector interface may be any standard RF connector interface like SMA, 2.92 mm, 1.85 mm or 1.0 mm. The RF connector interface may provide a coaxial connector interface that generally has an outer conductor and an internal conductor (including a center conductor member and/or an inner conductor member). The coaxial RF connector interface may be mounted or attached to the housing. The outer conductor may be part of the housing, such that it is monolithic with the housing.

The housing may include a metal block having a cuboid shape. The housing includes at least one, or it may include two surface mount sections which may be part of the housing and may be monolithic with the housing. The surface mount sections may be formed as side wings to the housing, therefore requiring less space and material. Furthermore, side wings provide lower thermal capacity. The at least one surface mount section has a plurality of surface mount studs which may be monolithic with the surface mount section and which have a planar end surface in the mounting plane. The surface mount studs may be soldered with their end surface to the surface of a printed circuit board. They may be soldered to a continuous metal surface, like a ground plane. The surface mount studs may be soldered to matching contact pads. These contact pads may be insulated from each other and/or from the system ground, as the ground connection may be done by the matching blocks, which are part of the PCB contact section and are arranged close to the inner conductor exit of the housing. The contact pads may also be used for further grounding the connector. When using contact pads matching to the surface mount studs, centering of each surface mount stud to the corresponding contact pad may automatically be done by surface tension of the soldering metal. Such a soldering metal may be any metal or combination of metals as known from prior art, e.g. tin, led, silver and others. The centering of the individual surface mount studs results in a total alignment of RF connector. Furthermore, the RF connector can easily be handled by automatic pick and place systems and needs no additional handling steps.

The housing may include a conductive material, which may be a metal.

As the RF connector outer conductor portion or member is connected to or part of the housing, the outer conductor can be contacted by means of the surface mount studs to a printed circuit board.

The center conductor (via its extension, referred to herein as an inner conductor, as will be discussed below) of the coaxial RF connector interface is guided through the housing, which may be within a coaxial bore to maintain the coaxial structure by minimizing reflections. As understood by a person of ordinary skill in the art, aggregately the center conductor (member) and the inner conductor (member) form an internal conductor (member) of the coaxial RF connector. The inner conductor is disposed to emerge from or exit the housing at the PCB contact section, which may be at a side opposing to the side of the coaxial RF connector interface, and has a contact area in the mounting plane. At the exit side of the housing close to the inner conductor is at least one matching block in electrical contact with the housing, which keeps the capacitance of the inner conductor in the area of the exit side and the contact to the strip line of the printed circuit board corresponding to the inductance, such that the characteristic impedance is always constant and the reflections are minimized. There may be two matching blocks symmetrically arranged. They may have a contact surface in the mounting plane such that they can contact a ground plane of the printed circuit board. The matching blocks may also act as soldering pads to provide an electrical connection to a ground plane of the printed circuit board.

For seating the housing, a cutout may be provided in the printed circuit board. The cutout may be at least slightly larger than the housing, such that there is a gap between the cutout and the housing. It is not necessary that the cutout exactly matches the housing and holds the housing, as the housing itself is precisely centered by the surface mount studs which are further centered to the contact pads. Such a precision alignment is necessary to provide a perfect alignment at the exit side of the inner conductor with the strip line, which further results in minimal reflections at high frequencies.

In an embodiment, an RF connector system is provided to include at least one RF connector structured as discussed above and a matching printed circuit board, structured as discussed above. To provide for self-alignment of the RF connector to the printed circuit board, the contact pads of the printed circuit board may match to the surface mount studs of the RF connector. The contact pads and the surface mount studs may have a rectangular, or a squared cross-section. The size of the contact pads may be by 0.05 mm to 0.15 mm larger than the size of the surface mount studs. The surface mount studs may also have a circular or elliptical shape, whereas the size of the contact pads, which may have a rectangular or circular or elliptical shape, may be in a range from 0.05 to 0.15 mm larger than the studs.

The housing and/or the surface mount stud as well as the matching blocks may have a surface, which can be soldered easily. The surfaces may be electro-plated.

BRIEF DESCRIPTION OF THE DRAWINGS

In the following, the invention will be described by way of examples and without limitation of the general inventive concept, with reference to the drawings of which.

While embodiments of the invention can be variously modified and assume alternative forms, specific embodiments are discussed below by way of example, in reference to corresponding drawings. It should be understood, however, that the presented drawings and detailed description are not intended to limit the invention to any particular form, but to the contrary, the intention is to cover all modifications, equivalents, and alternatives falling within the spirit and scope of the present invention as defined by the appended claims.

DETAILED DESCRIPTION

Figure 1:
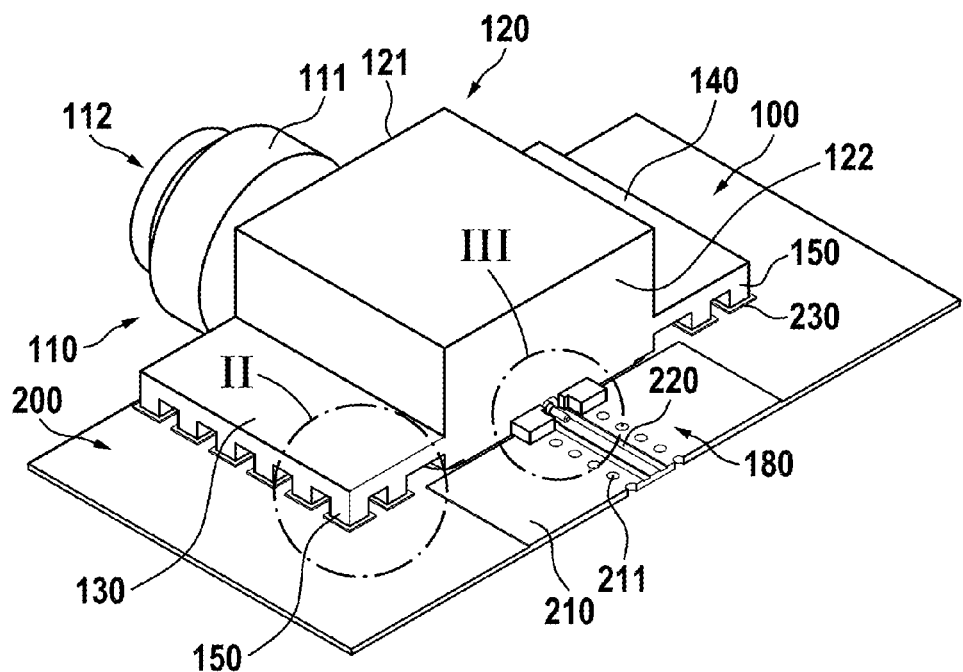
FIG. 1 shows a perspective view of the RF connector with PCB interface.

FIG. 1 shows a perspective view of the RF connector with PCB interface 100. It contains a housing 120 including, holding, or being one part with a coaxial RF connector interface 110.

The coaxial RF connector interface 110 has an outer conductor 111 (interchangeably referred to as an outer conductor member) and a center conductor 112 (interchangeably referred to as a center conductor member) that is coaxial to and with the outer conductor 111. The center conductor 112 cannot be seen in FIG. 1, but will be shown later in detail. The coaxial RF connector interface may be of any type. It may be male, female, or of a hermaphroditic type.

The housing 120, which may include a metal and may have a cuboid shape furthermore has at least one surface mount section 130, 140, which may be symmetrically arranged (located, disposed) at two opposing sides of the housing. The surface mount sections may have the shape of side wings. The thickness(es) of the surface mount sections may be smaller that the thickness of the housing, therefore requiring less material and providing a lower thermal capacity, which may be beneficial for soldering. The at least one surface mount section includes a plurality of surface mount studs 150. The surface mount studs may be arranged in a common mounting plane, such that a printed circuit board may be attached thereto. The surface mount studs may have a rectangular or squared cross-section, but they may have any other shape like a circular or elliptical cross-section. The surface mount sections may have a cuboid shape above the mounting plane with surface mount studs extending towards the mounting plane. The surface mount studs may be arranged in (that is, aggregately form) at least one row and at least one column at the common mounting plate.

The housing 120 may have a first side 121 with the coaxial RF connector interface and an exit side 122 bearing the PCB contact section 180 which may be opposing thereto. The exit side is used for contacting an inner conductor connected to or being part of the center conductor 112 to a printed circuit board, which is explained in more detail below.

Furthermore, FIG. 1 shows a printed circuit board 200 having a plurality of contact pads 230 aligned with the surface mount studs. Furthermore, the printed circuit board has a strip line 220 and at least one (here: two) ground plane sections 210 insulated from the strip line. These ground plane sections may be electrically connected together by a plurality of through-holes 211 passing to a lower electrical layer in the printed circuit board, which cannot be shown here. This layer connects the ground plane sections under (or over) the strip line.

Figure 2:
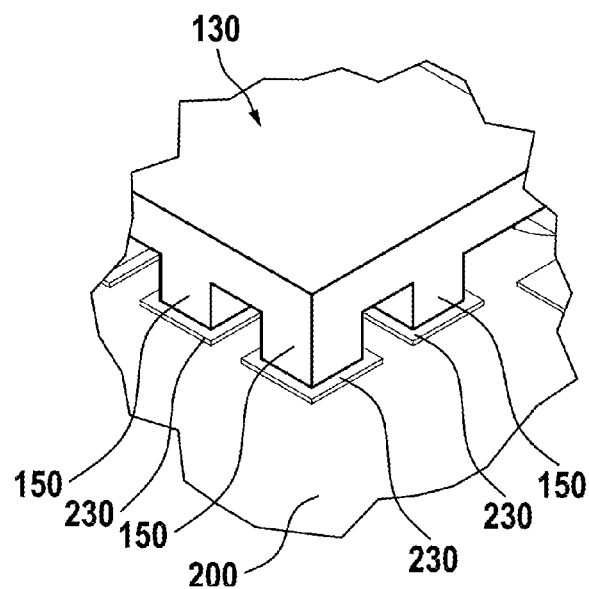
FIG. 2 illustrates a detailed view of a surface mount section.

In FIG. 2, a detailed view of a surface mount section 130 (section II of FIG. 1) is shown, the second 130 having a plurality of surface mount studs 150 which may be soldered to respectively-matching contact pads 230 of the printed circuit board 200.

Figure 3:
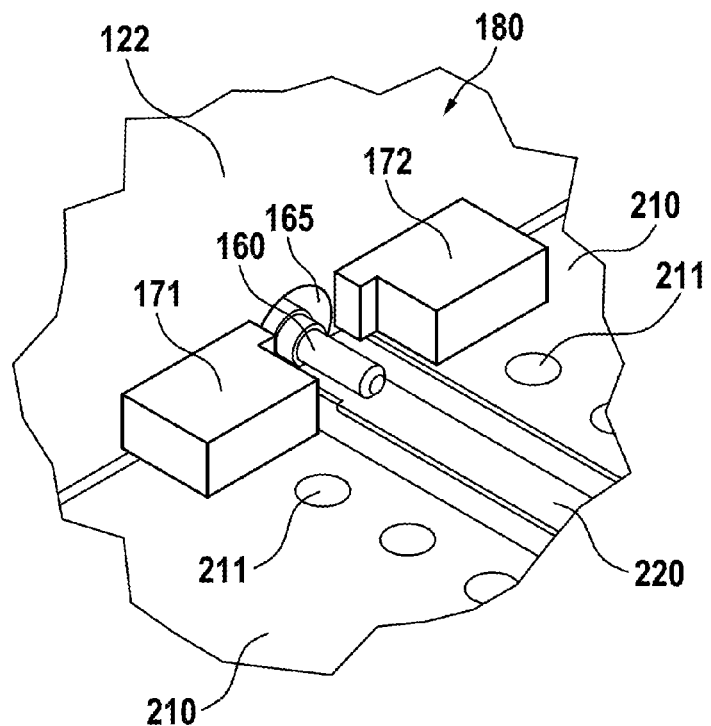
FIG. 3 depicts a detail of the inner conductor connection.

In FIG. 3, details of the connection of inner conductor 160 (section III of FIG. 1) is shown. The inner conductor 160 (which, in practice, is an electrical extension of the conductor 112) is disposed to exit the exit side 122 of the housing through a bore 165, and may be soldered to a strip line 220. To keep the end section of the inner conductor 160 with minimized reflections (that is, to optimize the impedance matching), one or two matching blocks 171, 172 may be provided at one or on two sides of the inner conductor. The matching blocks may be dimensioned such that a distance, at a given plane, between the inner conductor and a matching block increases as the distance between this plane and the housing is increased, to respectively reduce capacitance between the matching block and the inner conductor. These matching blocks also may be used to contact the housing 120 to a ground plane 210 of the printed circuit board by being soldered thereto.

Figure 4:
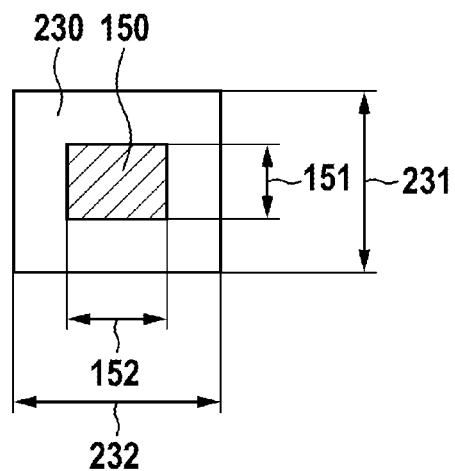
FIG. 4 presents details of a surface mount stud.

In FIG. 4, details of a surface mount stud 150 are shown; the surface mount stud 150 is shown soldered on a matching contact pad 230. In this specific example, the stud and the pad have rectangular cross-sections, or squared cross-sections. The surface mount stud 150 has a first side length 151 and a second side length 152. The contact pad 230 has a first side length 231 and a second side length 232. The first side length 151 of the surface mount stud may be by 0.05 mm to 0.15 mm shorter than the first side length 231 of contact pad 230. The second side length 152 of the surface mount stud may be shorter than the second side length 232 of contact pad 230 by, for example, 0.05 mm to 0.15 mm.

Figure 5:
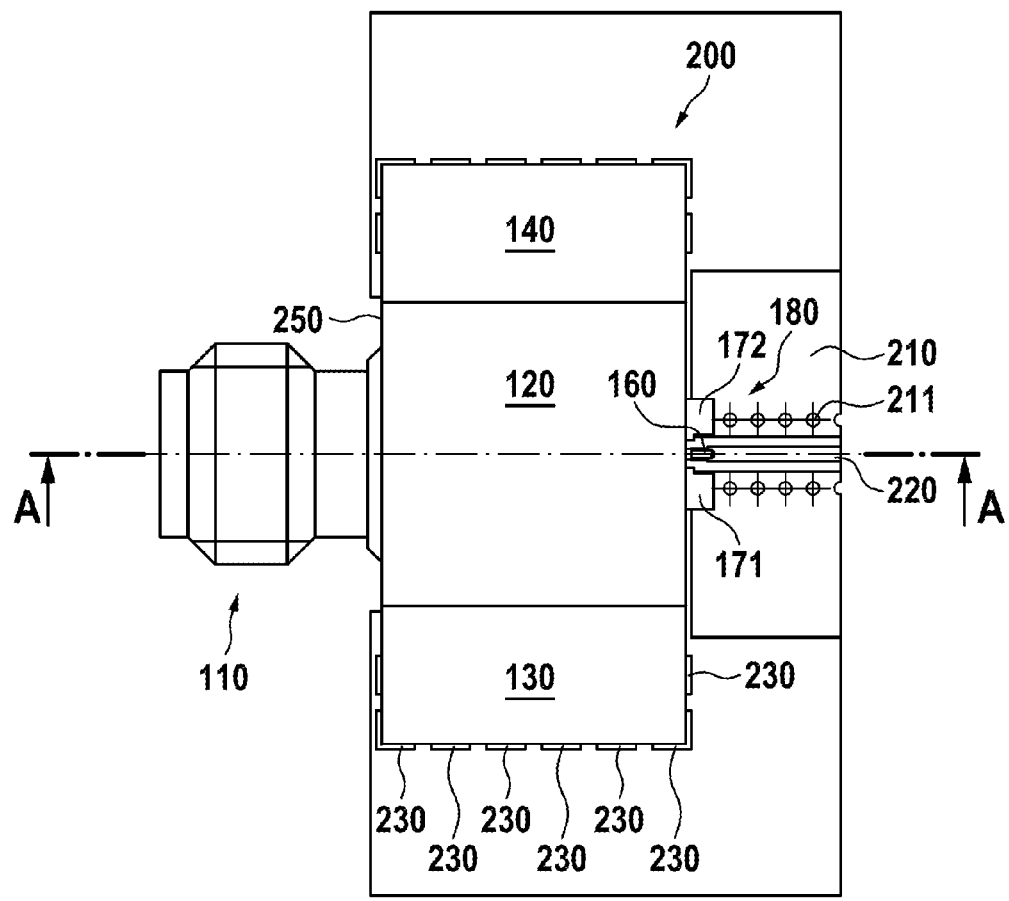
FIG. 5 shows a top view of a RF connector with PCB interface.

FIG. 5 shows a top view of the RF connector with PCB interface 100 mounted to a printed circuit board. FIG. 5 illustrates the contact pads 230 as well as the ground plane 210 together with strip line 220. For seating the housing, a cutout 250 may be provided in the printed circuit board.

The cutout may be at least slightly larger than the housing, such that there may be a gap between the cutout and the housing. It is not necessary that the cutout exactly matches to the housing and holds the housing, as the housing itself is precisely centered by the surface mount studs which may further be centered to the contact pads. Such a precision alignment is necessary to provide a perfect alignment at the exit side of the inner conductor with the strip line, which further results in minimal reflections (that is, optimized impedance) at high frequencies.

Figure 6:
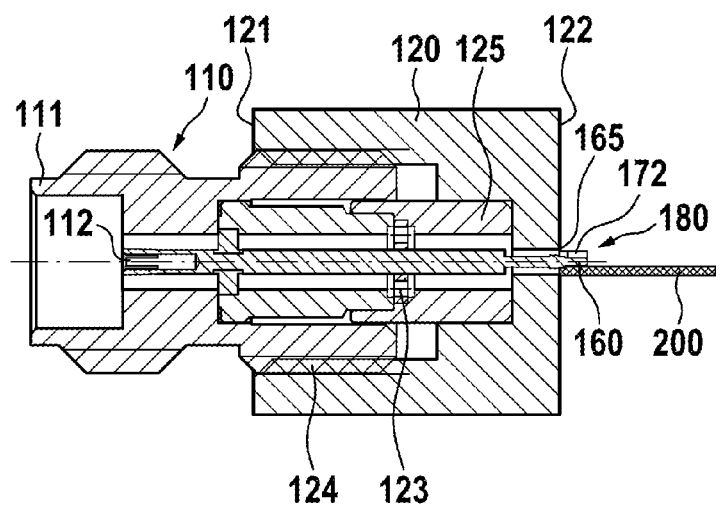
FIG. 6 illustrates a sectional view of the RF connector with PCB interface.

In FIG. 6, a sectional view of the RF connector with PCB interface is shown. This view illustrates the path of the center conductor connection. The center conductor 112 of the coaxial RF connector interface is electrically and structurally extended and guided as an inner conductor 160 through a bore 165 at exit side 122. The inner conductor 160 may be structured as one integral piece with the center conductor 112. It may also be a separated wire or other metal structure electrically and/or mechanically connected to the center conductor 112 to form the extension of the conductor 112 through the bore 165. The center conductor 112 and/or inner conductor 160 may be mechanically supported by spacers 123, which in one case may be held by outer conductor sections 125. In FIG. 6, the Coaxial RF connector interface 110 is shown to be held by a thread 124 in the housing 120. Therefore, the interface 110 may be replaced or it may be part of a modular system including multiple different connector interfaces fitting into the same housing.

Figure 7:
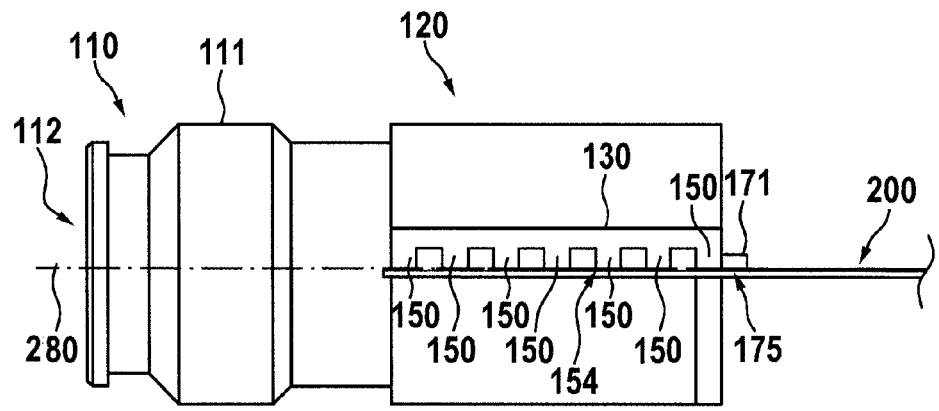
FIG. 7 provides a side view of the RF connector.

In FIG. 7, a side view of the RF-connector is shown. This side view depicts the mounting plane 280 which is in this view the plane defining the bottom of the surface mount stud and other contact parts as well as the top side of printed circuit board 200. FIG. 7 also indicates the planar surfaces 154 at the end of surface mount studs 150. The planar surface 154 is in the mounting plane. Also the matching block contact surface 175 of matching block 171 is shown. This surface is shown to be configured as the mounting plane.

Figure 8:
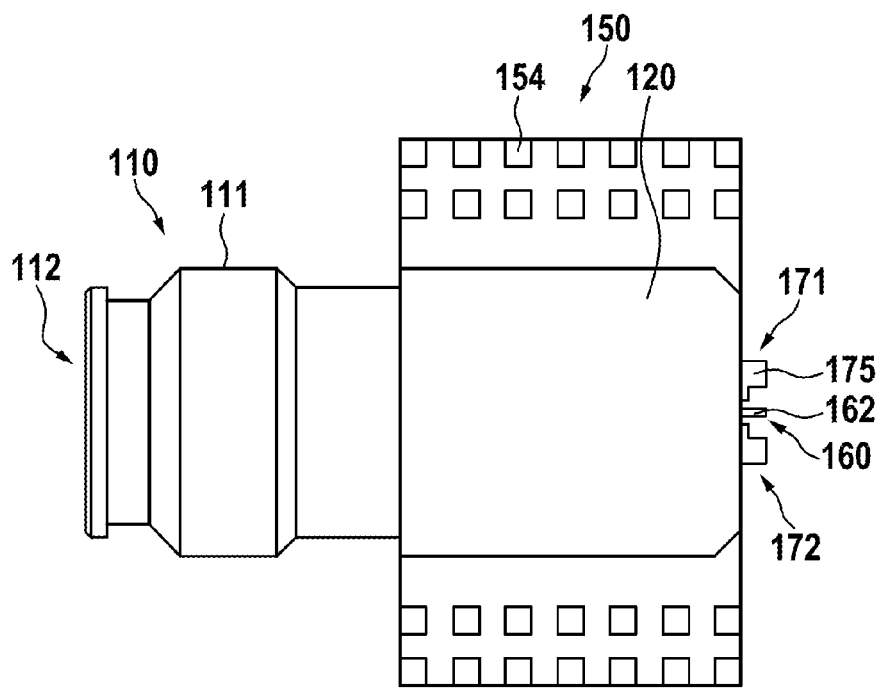
FIG. 8 shows a bottom view of the RF connector.

FIG. 8 illustrates a bottom view of the connector. Here, the planar surfaces 154 are shown, as well as the matching block contact surface 175 and the contact area 162 of the inner conductor.

Figure 9:
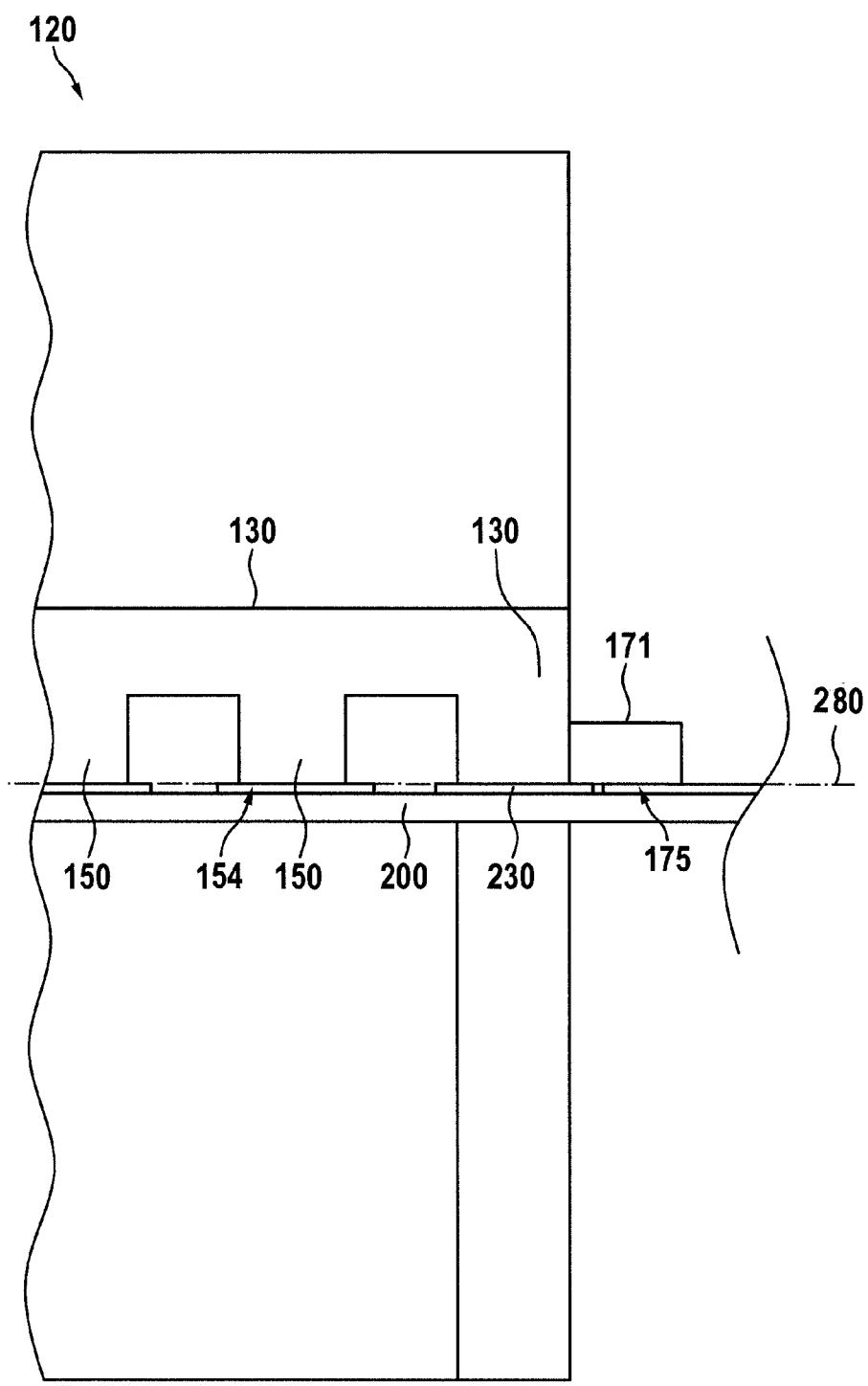
FIG. 9 is an enlarged sectional view of FIG. 7.

FIG. 9 shows an enlarged sectional view of FIG. 7.

It will be appreciated to those skilled in the art having the benefit of this disclosure that this invention is believed to provide an RF connector. Further modifications and alternative embodiments of various aspects of the invention will be apparent to those skilled in the art in view of this description. Accordingly, this description is to be construed as illustrative only and is provided for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed and/or modified, and certain features of the invention may be utilized independently, all as would be apparent to one skilled in the art after having the benefit of this description of the invention. Changes may be made in the elements described herein without departing from the spirit and scope of the invention as described in the following claims.

LIST OF REFERENCE NUMERALS

100 RF connector with PCB interface
110 Coaxial RF connector interface
111 outer conductor (outer conductor member)
112 center conductor (center conductor member)
120 housing
121 Coaxial RF connector interface (first) side of housing
122 exit side of housing
123 spacer
124 thread
125 outer conductor section
130, 140 surface mount section
150 surface mount stud
151 first side length
152 second side length
154 planar end surface
160 inner conductor (inner conductor member)
162 contact area
165 bore
171, 172 matching blocks
175 matching block contact surface
180 PCB contact section
200 printed circuit board (PCB)
210 ground plane
211 through holes
220 strip line
230 contact pads
231 first side length
232 second side length
250 cutout
280 mounting plane

The invention claimed is:

1. An RF-PCB connector with a PCB interface, comprising a housing, a coaxial RF connector interface and a PCB contact section,
the RF-PCB connector defining a mounting plane;
the coaxial RF connector interface comprising an outer conductor member and a center conductor member, the outer conductor member being connected to the housing and the center conductor member;
the housing having a body, wherein the body is limited at opposing sides of the body and along a full length of the body by spatially-distinct first and second opposing surfaces; and
two surface mount sections, which are symmetrically arranged at the first and second opposing surfaces such that a first of the two mount sections is directly attached to the first opposing surface and a second of the two mount sections is directly attached to the second opposing surface, the body being between the first and second mount sections;
at least one of the two surface mount sections further comprising a plurality of surface mount studs, each surface mount stud having a planar end surface in the mounting plane;
the PCB contact section comprising an inner conductor member that is electrically connected with the center conductor member and passing through a bore of the housing and that has a contact area in the mounting plane; and a pair of matching blocks extending from the housing on two sides of the inner conductor, each matching block having a contact surface in the mounting plane and being electrically connected to the housing and providing a matched impedance at the PCB contact section.

2. The RF-PCB connector according to claim 1, wherein at least one matching block from said pair is dimensioned to have a distance between said at least one matching block and the inner conductor increased as a function of a distance from the housing.

3. The RF-PCB connector according to claim 1, wherein the housing comprises a metal block having a cuboid shape.

4. The RF-PCB connector according to claim 1, wherein the surface mount sections have smaller thicknesses than that of the housing.

5. The RF-PCB connector according to claim 1, wherein the surface mount studs have rectangular cross-sections or squared cross-sections.

6. The RF-PCB connector according to claim 1, wherein the surface mount sections have cuboid shapes above the mounting plane with surface mount studs extending towards the mounting plane.

7. The RF-PCB connector according to claim 1, wherein multiple surface mount studs of at least one of the two surface mount sections are arranged in at least one row and at least one column.

8. The RF-PCB connector according to claim 1, wherein the PCB contact section is disposed at an exit side of the housing opposing to a first side with the coaxial RF connector interface.

9. An RF connector system comprising:
the RF-PCB connector according to claim 1 and a Printed Circuit Board (PCB),
wherein the PCB comprises at least one contact pad matched to the at least one surface mount stud, at least one strip line matched to the at least one inner conductor and at least one ground plane of the PCB matched to the at least one matching block from said pair.

10. The RF connector system according to claim 9, wherein the at least one strip line is insulated from and in a PCB layer above or under the at least one ground plane.

11. The RF connector system according to claim 9, wherein the at least one contact pad is electrically insulated from the at least one ground plane.

12. The RF-PCB connection according to claim 1, wherein each of the two surface mount sections comprises a corresponding plurality of surface mount studs, each surface mount stud having a planar end surface in the mounting plane.

13. The RF-PCB connector according to claim 1, wherein multiple surface mount studs of said at least one surface mount sections are arranged in a two-dimensional array.

14. The RF-PCB connector according to claim 1, wherein the first and second mount sections protrude away, from said respectively-correspondence first and second opposing surfaces, in opposite directions with respect to one another.

* * * * *